(12) United States Patent
Kim et al.

(10) Patent No.: US 12,740,121 B2
(45) Date of Patent: Sep. 15, 2026

(54) SEMICONDUCTOR DEVICE AND METHOD OF MANUFACTURING THE SAME

(71) Applicant: ELECTRONICS AND TELECOMMUNICATIONS RESEARCH INSTITUTE, Daejeon (KR)

(72) Inventors: Sang Hoon Kim, Daejeon (KR); Dongwoo Suh, Daejeon (KR); Jinha Kim, Daejeon (KR); Jeong Woo Park, Daejeon (KR); Seong Hyun Lee, Daejeon (KR); Wangjoo Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 569 days.

(21) Appl. No.: 18/327,417

(22) Filed: Jun. 1, 2023

(65) Prior Publication Data

US 2023/0402529 A1 Dec. 14, 2023

(30) Foreign Application Priority Data

Jun. 13, 2022 (KR) ........................ 10-2022-0071639
May 17, 2023 (KR) ........................ 10-2023-0063664

(51) Int. Cl.
*H10D 64/01* (2025.01)
*H10D 30/67* (2025.01)
*H10D 30/69* (2025.01)

(52) U.S. Cl.
CPC ....... *H10D 64/017* (2025.01); *H10D 30/6735* (2025.01); *H10D 30/6757* (2025.01); *H10D 30/751* (2025.01); *H10D 64/018* (2025.01)

(58) Field of Classification Search
CPC .............. H10P 14/2905; H10P 14/3211; H10P 14/3252; H10P 14/3411; H10D 30/014;
(Continued)

(56) References Cited

U.S. PATENT DOCUMENTS 9,966,471 B2 5/2018 Ching et al.
10,249,750 B2 4/2019 Bae et al.
11,289,600 B2 3/2022 Choi
(Continued)

FOREIGN PATENT DOCUMENTS

JP 2022-27719 A 2/2022
KR 1999-0080164 A 11/1999
(Continued)

OTHER PUBLICATIONS

N. Loubet et al., “A Novel Dry Selective Etch of SiGe for the Enablement of High Performance Logic Stacked Gate-All-Around NanoSheet Devices” 2019 IEEE, 2019.
(Continued)

*Primary Examiner* — Jessica S Manno
*Assistant Examiner* — Sandra Milena Rodriguez Villanu

(57) ABSTRACT

A method of manufacturing a semiconductor device is provided. The method includes forming alternating layers, where a silicon germanium layer and a silicon layer are alternately stacked, on a substrate, etching the alternating layers to form a fin structure protruding onto the substrate and then forming a silicon nitride film on a surface and a sidewall of each of the alternating layers having the fin structure, sequentially forming a dummy gate and a silicon oxide film on the alternating layers with the silicon nitride film therebetween and then forming a gate spacer on a sidewall of the dummy gate, etching the silicon nitride film upward exposed, and then, etching the alternating layers by using the silicon oxide film, and selectively forming an inner spacer in a sidewall of each of silicon germanium layers
(Continued)

among the silicon germanium layers and silicon layers of the etched alternating layers.

18 Claims, 12 Drawing Sheets

(58) Field of Classification Search
CPC .... H10D 30/43; H10D 62/121; H10D 62/822; H10D 84/0151; H10D 84/038; H10D 30/6735; B82Y 10/00
See application file for complete search history.

(56) References Cited

U.S. PATENT DOCUMENTS

| | | | | |
|---|---|---|---|---|
| 12,317,540 | B2 * | 5/2025 | Chen | H10D 30/6706 |
| 12,477,775 | B2 * | 11/2025 | Lung | H10D 30/6713 |
| 2018/0301564 | A1 * | 10/2018 | Kwon | H10D 30/6713 |
| 2019/0378915 | A1 * | 12/2019 | Frougier | H10D 64/017 |
| 2020/0168742 | A1 * | 5/2020 | Wang | H10D 30/6713 |
| 2023/0060825 | A1 * | 3/2023 | Kao | H10D 30/6735 |
| 2023/0118990 | A1 * | 4/2023 | Chang | H10D 64/01 257/288 |

FOREIGN PATENT DOCUMENTS

| | | | |
|---|---|---|---|
| KR | 10-0707208 | B1 | 4/2007 |
| KR | 10-2014-0114517 | A | 9/2014 |
| KR | 10-2020-0145974 | A | 12/2020 |
| KR | 10-2021-0084206 | A | 7/2021 |
| KR | 10-2021-0086942 | A | 7/2021 |
| KR | 10-2301251 | B1 | 9/2021 |
| KR | 10-2311155 | B1 | 10/2021 |
| KR | 10-2021-0131957 | A | 11/2021 |
| KR | 10-2022-0016788 | A | 2/2022 |
| KR | 10-2022-0070518 | A | 5/2022 |

OTHER PUBLICATIONS

A.Agrawal et al., "Gate-All-Around Strained Si0.4Ge0.6 Nanosheet PMOS on Strain Relaxed Buffer for High Performance Low Power Logic Application", 2020 IEEE, 2020.

Yoongeun Seon et al., "Device and Circuit Exploration of Multi-Nanosheet Transistor for Sub-3 nm Technology Node", MDPI Electronics, 2021.

* cited by examiner

SEMICONDUCTOR DEVICE AND METHOD OF MANUFACTURING THE SAME

CROSS-REFERENCE TO RELATED APPLICATIONS

This application claims the benefit of the Korean Patent Application No. 10-2022-0071639 filed on Jun. 13, 2022 and 10-2023-0063664 filed on May 17, 2023, which is hereby incorporated by reference as if fully set forth herein.

BACKGROUND

Field of the Invention

The present invention relates to a semiconductor device and a method of manufacturing the same, and more particularly, to a semiconductor device designed as a gate-all-around (GAA) field effect transistor (FET) and a method of manufacturing the semiconductor device.

Discussion of the Related Art

To overcome a structural limitation of semiconductor devices having a planar structure, Fin-FET technology based on a three-dimensional structure has been introduced. The term "Fin-FET" is a compound word of fin and FET, and Fin-FETs have a structure where a gate surrounds some surfaces (for example, three surfaces) of a channel. Because a contact area between the gate and the channel increases based on the structure, an operation speed and productivity may be enhanced and power consumption may be reduced, without an increase in device size. Also, the Fin-FET technology enables a size of complementary metal-oxide-semiconductor (CMOS) to be easily controlled.

In terms of CMOS architecture and foundry, the Fin-FET technology is advancing to GAA-FET technology which is more improved. GAA-FETs have a structure where a gate surrounds all surfaces (for example, four surfaces) of a channel, and thus, because a contact area is more enlarged than Fin-FETs, GAA-FETs decrease more in size and provide better current driving capability than the Fin-FET technology and considerably reduce a leakage current in a power-off state.

It is very difficult to manufacture GAA-FET devices, and particularly, a high-level process is needed for manufacturing of GAA-FET devices where channels having a thickness of tens nm or less are stacked, but research and development thereon is still insufficient.

PRIOR ART REFERENCE

Patent Document

Korean Patent Publication No. 10-2016-0099445
Published Date: Aug. 8, 2016
Invention Title: STACKED GATE-ALL-AROUND FIN-FET AND METHOD FORMING THE SAME

SUMMARY

An aspect of the present invention is directed to providing a method of manufacturing a semiconductor device, and more particularly, to providing a method of manufacturing a channel stacked GAA-FET device requiring a high-level process.

To achieve these and other advantages and in accordance with the purpose of the invention, as embodied and broadly described herein, there is provided a method of manufacturing a semiconductor device, the method including: forming alternating layers, where a silicon germanium layer and a silicon layer are alternately stacked, on a substrate; patterning and etching the alternating layers to form a fin structure protruding onto the substrate, and then, forming a silicon nitride film on a surface and a sidewall of each of the alternating layers having the fin structure; sequentially forming a dummy gate and a silicon oxide film on the alternating layers with the silicon nitride film therebetween, and then, forming a gate spacer on a sidewall of the dummy gate; etching the silicon nitride film upward exposed, and then, etching the alternating layers by using the silicon oxide film as a hard mask; and selectively forming an inner spacer in a sidewall of each of silicon germanium layers among the silicon germanium layers and silicon layers of the etched alternating layers.

In another aspect of the present invention, there is provided a semiconductor device including: a substrate; a plurality of sources/drains disposed on the substrate; a plurality of silicon layers disposed on the substrate to function as a channel layer, the plurality of silicon layers being stacked between adjacent sources/drains; a gate electrode disposed in a space formed between upper portions of the plurality of silicon layers and the plurality of silicon layers; an inner spacer supporting the space; and an insulator preventing short circuit between the sources/drains and the gate electrode disposed on the plurality of silicon layers.

It is to be understood that both the foregoing general description and the following detailed description of the present invention are exemplary and explanatory and are intended to provide further explanation of the invention as claimed.

DETAILED DESCRIPTION OF THE INVENTION

Figure 1:
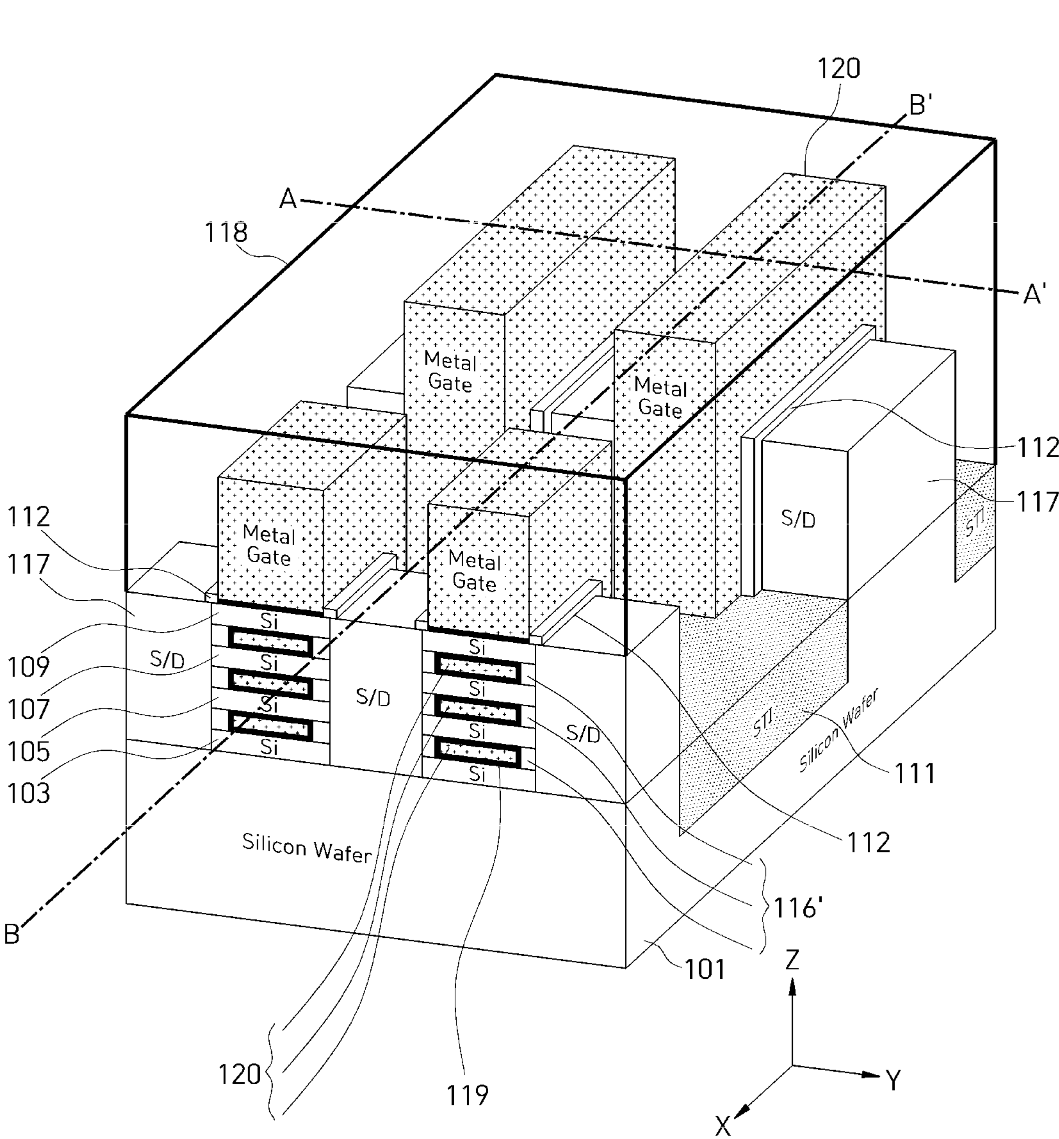
FIG. 1 is a perspective view illustrating a three-dimensional (3D) structure of a semiconductor device according to an embodiment of the present invention.

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout.

In the specification, when an arbitrary material layer such as a layer or a film is described as being "on" another material layer or a substrate, this may denote that the arbitrary material layer may be formed directly on the other material layer or the substrate or another material layer may be disposed therebetween.

In various embodiments of the specification, the terms "first", "second", and "third" are used to describe material layers or process steps, but this is merely used to differentiate an arbitrary material layer or a process step from another material layer or another process step and embodiments of the present invention are not limited to the terms.

In the following description, the technical terms are used only for explain a specific exemplary embodiment while not limiting the present invention. The terms of a singular form may include plural forms unless referred to the contrary. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. The embodiments of the present invention are not limited to the specific shape illustrated in the exemplary views, but may include other shapes that may be created according to manufacturing processes. For example, an etching region illustrated as a right angle may have a shape that is rounded or a certain curvature. Therefore, areas exemplified in the drawings have general properties, and are used to illustrate a specific shape of a semiconductor package region. Thus, this should not be construed as limited to the scope of the present invention.

FIG. 1 is a perspective view illustrating a three-dimensional (3D) structure of a semiconductor device according to an embodiment of the present invention.

Referring to FIG. 1, the semiconductor device according to an embodiment of the present invention may be a channel stacked GAA-FET device which has advanced from a FinFET device.

The semiconductor device designed as a GAA-FET device may include a substrate 101, a plurality of sources/drains 117 disposed on the substrate 101, a plurality of silicon layers 103, 105, 107, and 109 which are channel layers disposed on the substrate 101 and are stacked between the sources/drains 117 adjacent thereto, a gate electrode 120 which is disposed in a space formed between the silicon layers 103, 105, 107, and 109 and on the silicon layers 103, 105, 107, and 109, an inner spacer 116' which supports the space, and an insulator 112 which prevents (blocks) short circuit between the sources/drains 117 and the gate electrode 120 disposed on the silicon layers 103, 105, 107, and 109.

The gate electrode 120 may be disposed in the space formed between the silicon layers 103, 105, 107, and 109 and on the silicon layers 103, 105, 107, and 109, and thus, may be provided in a structure which surrounds the silicon layers 103, 105, 107, and 109 used as a channel layer.

The gate electrode 120 may share the sources/drains 117 adjacent thereto, and thus, may be configured as a GAA-FET device. The GAA-FET device and another GAA-FET device may be isolated from each other by a shallow trench isolation (STI) layer 111.

The inner spacer 116' which supports the space formed between the silicon layers 103, 105, 107, and 109 may be a silicon oxide film (or a third silicon oxide film), and the insulator 112 which prevents short circuit between the sources/drains 117 and the gate electrode 120 may be a silicon nitride film. The insulator 112 may be processed as a "1"-shape in a plate-shaped thin film through an etching process which will be described below.

In FIG. 1, a reference numeral "118" may refer to a silicon oxide film (a fourth silicon oxide film) which covers a front surface of the substrate 101 and is illustrated as a transparent element so as to clearly show an inner 3D structure of the semiconductor device. In FIG. 1, a reference numeral "119" may refer to a gate dielectric layer. The gate dielectric layer 119 may be disposed between the gate electrode 120 and the silicon layers 103, 105, 107, and 109 used as a channel layer.

Hereinafter, a method of manufacturing the semiconductor device illustrated in FIG. 1 will be described in detail with reference to FIGS. 2 to 22. In FIG. 1, four silicon layers 103, 105, 107, and 109 are illustrated, but for conciseness of illustration, it should be noted that only silicon layers 103, 105, and 107 are illustrated in FIGS. 2 to 22.

FIGS. 2 to 22 are cross-sectional views taken along line A-A' and line B-B' illustrated in FIG. 1.

Figure 2:
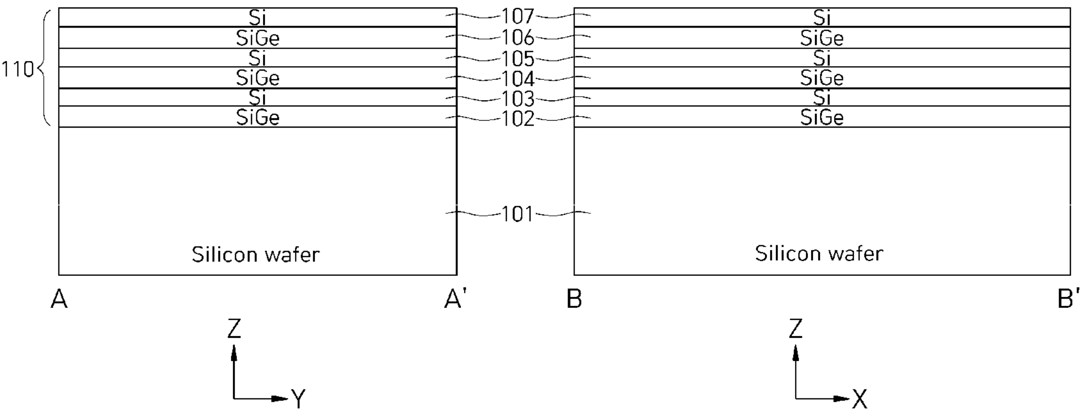
FIG. 2, FIG. 3, FIG. 4, FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21 and FIG. 22 are cross-sectional views taken along line A-A' and line B-B' illustrated in FIG. 1.

First, referring to FIG. 2, a process of forming alternating layers 110, where a silicon germanium layer 102 and a silicon layer 103 are alternately stacked, on the substrate 101 may be performed.

The substrate 101 may be a semiconductor substrate which includes silicon, germanium, or silicon-germanium. Also, the substrate 101 may include a silicon substrate or a silicon-on-insulator (SOI) substrate, or may include a p-type, n-type, or intrinsic silicon substrate.

The silicon germanium layer 102 and the silicon layer 103 may be successively grown on the substrate 101. The silicon germanium layer 102 and the silicon layer 103 may each be a thin film having a thickness of tens nm or less. For example, a thickness of the silicon germanium layer 102 and the silicon layer 103 may be within a range between about 5 nm and about 8 nm. A germanium percentage (an atomic percentage) of the silicon germanium layer 102 may be within a range between about 25% and about 35%, but is not limited thereto and a relatively higher or lower germanium percentage may be used.

The silicon germanium layer 102 and the silicon layer 103 may be formed by an epitaxial growth process using the substrate 101 as a seed layer. In this case, the silicon germanium layer 102 may be referred to as silicon germanium (SiGe) ($Si_{1-x}Ge_x$: x may be 0 to 1) epitaxial layer (epi) layer, and the silicon layer 103 may be referred to as a silicon (Si) epi layer.

The epitaxial growth process may include, for example, a chemical vapor deposition (CVD) process, an atomic layer deposition (ALD) process, or a molecular beam epitaxy (MBE) process.

The silicon germanium layer 102 may be used as a sacrificial layer which is selectively etched in a post process, and the silicon layer 103 may be used as a channel layer of the GAA-FET device. In this case, the number of recurring growths of the silicon germanium layer 102 and the silicon layer 103 may be equal to the number of channel layers of the GAA-FET device. The silicon layer 103 used as a channel layer may be referred to as a semiconductor layer.

A difference between a lattice constant of silicon and a lattice constant of germanium may be about 4.3%. Due to this, a stress may occur in recurring growths of the silicon germanium layer 102 and the silicon layer 103. In this state, when the silicon germanium layer 102 and the silicon layer 103 exceed a threshold thickness, accumulated strain energy may be discharged, and thus, a stress may be reduced. In such a process, an interfacial dislocation may be generated, the performance of a device may be reduced, and a leakage current may occur.

As the number of recurring growths of the silicon germanium layer 102 and the silicon layer 103 increases, a stress applied to the silicon germanium layer 102 and the silicon layer 103 may increase, and a dislocation density may increase. Accordingly, a problem where the number of silicon channels of the GAA-FET device may occur.

To solve such a problem, in the present embodiment, a low-temperature recurring cooling process may be proposed as a method for decreasing a stress occurring in performing the recurring growths of the silicon germanium layer 102 and the silicon layer 103.

The low-temperature recurring cooling process may be a process which successively grows the silicon germanium layer 102 and the silicon layer 103 at a first temperature, cools the grown silicon germanium layer 102 and silicon layer 103 at a second temperature which is lower than the first temperature, and successively grows another silicon germanium layer 102 and another silicon layer 103 at the first temperature again. That is, the low-temperature recurring cooling process may denote a process of repeatedly growing and cooling a grown silicon germanium layer and a silicon layer.

The low-temperature recurring cooling process may use a thermal expansion coefficient difference between silicon and germanium and may reduce a stress between SiGe and silicon. Here, the first temperature which is a growth temperature may be, for example, about 500° C. to about 800° C., and the second temperature which is a cooling temperature may be, for example, about 300° C. to about 400° C.

Growth of a silicon germanium layer and a silicon layer may be performed as a CVD process using radiant heat by lamp heating, and rapid cooling and rapid heating may be performed through lamp heating.

In a case where growth of SiGe and silicon is performed by a CVD process, an ALD process, or an MBE process, rapid cooling and rapid heating may be performed by rapid thermal annealing (RTA) equipment after epi growth is completed.

As described above, in order to decrease a stress occurring in performing the recurring growth of a silicon germanium layer and a silicon layer, the present invention may repeatedly grow the silicon germanium layer and the silicon layer by using a low-temperature recurring cooling process, and thus, may stack single crystal silicon layers having no defect and may increase the number of stacks of the silicon layer. Accordingly, a driving current may be enhanced, and a leakage current may be reduced.

In FIG. 2, a case where a silicon germanium layer and a silicon layer are repeatedly grown three times is illustrated, but the present invention is not limited thereto. Accordingly, the number of recurring growths of a silicon germanium layer and a silicon layer may be four times or more.

Referring to FIGS. 3 to 6, a process (FIGS. 3, 4, and 5) of patterning and etching the alternating layers 110 to form a fin structure protruding onto the substrate 101 may be performed, and then, a process (FIG. 6) of forming a silicon nitride film on surfaces and sidewalls of the alternating layers 110 having the fin structure may be performed.

Figure 3:
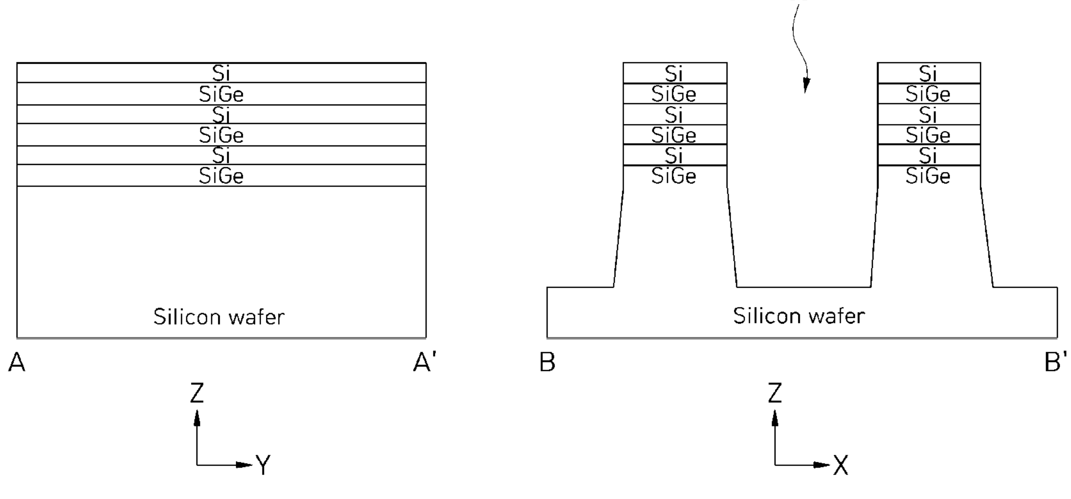

In detail, referring to FIG. 3, the fin structure may be implemented by patterning and etching the alternating layers 110 having the fin structure to form a trench 30. The trench 30 may be formed by sequentially performing a photolithography process, an etching process, and an ashing process of removing a photoresist film formed in the photolithography process, after a trench position is determined.

Figure 4:
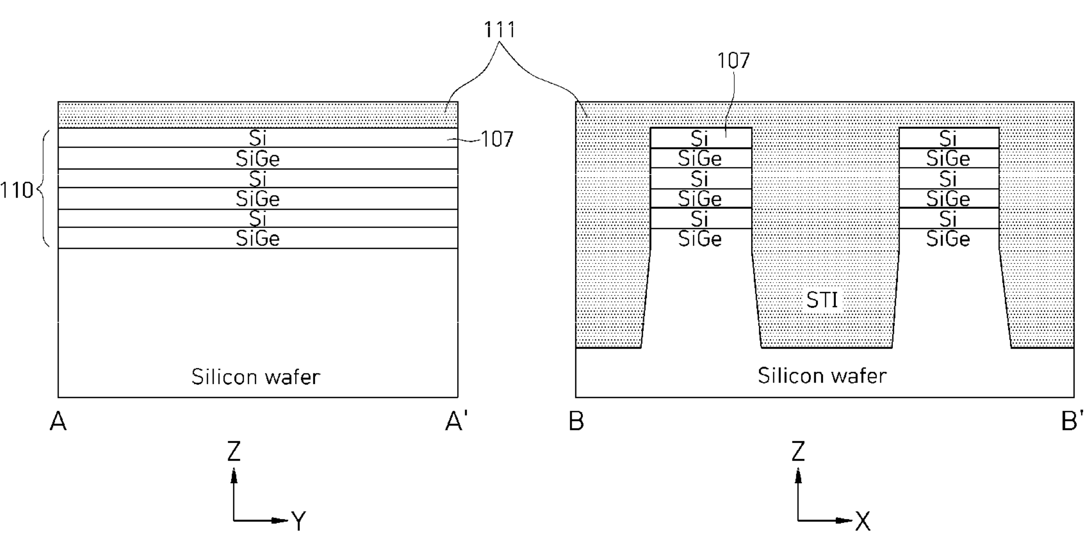

Subsequently, referring to FIG. 4, an STI process of forming the STI film 111 in the trench 30 simultaneously with covering the alternating layers 110 may be performed.

The STI process may include a deposition process of filling the STI film 111 in the trench 30 and a chemical mechanical polishing (CMP) process of removing a surface step height of the STI film 111. The deposition process may be a CVD process, an atmospheric pressure CVD (APCVD) process, a low pressure CVD (LPCVD) process, a plasma enhanced CVD (PECVD) process, and a high density or plasma CVD process. The CMP process may be performed to remove the surface step height of the STI film 111 so that the surfaces of the alternating layers 110 are not exposed. The surfaces of the alternating layers 110 may each be a surface of an uppermost silicon layer 107 in the alternating layers 110. The STI film 111 may be a silicon oxide ($SiO_2$) film.

Figure 5:
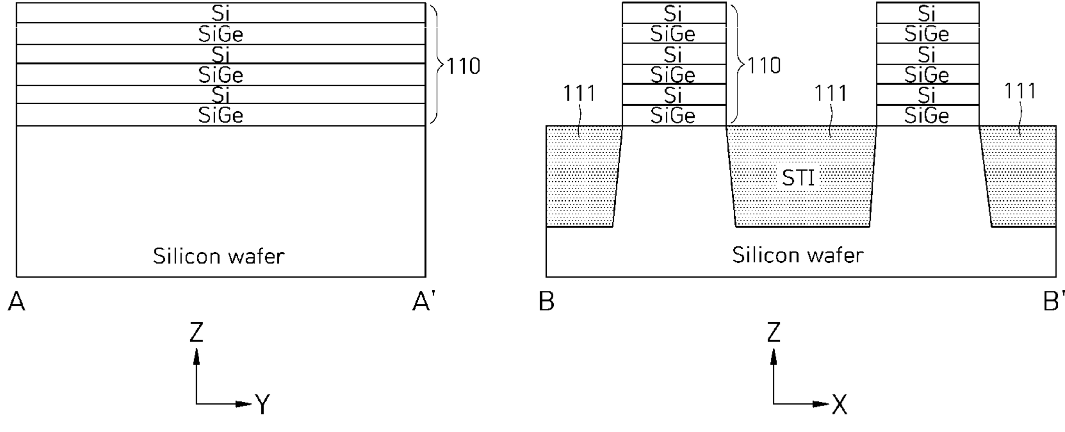

Subsequently, referring to FIG. 5, a process of removing the STI film 111 to expose the sidewalls of the alternating layers 110 may be performed. To this end, a wet etching process may be used.

Figure 6:
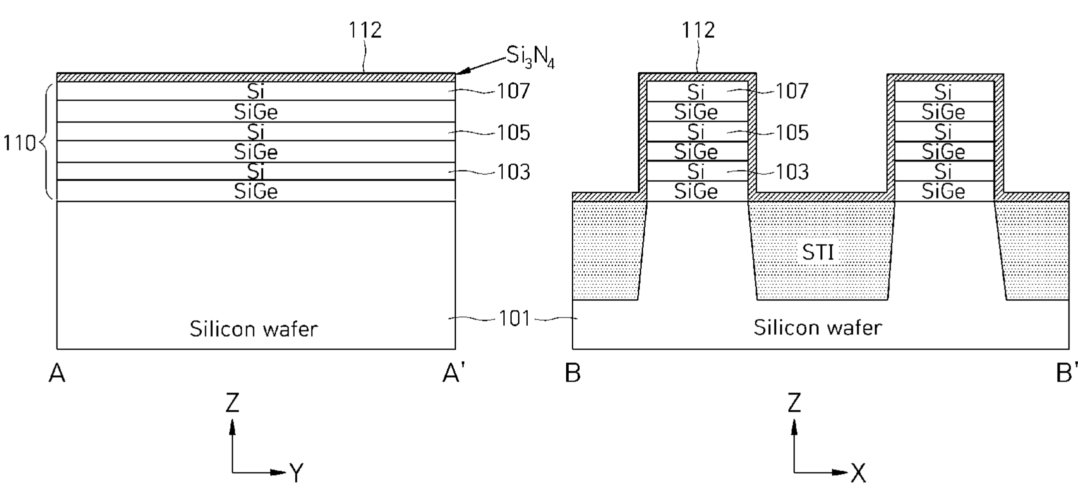

Subsequently, referring to FIG. 6, a process of forming a silicon nitride ($Si_3N_4$ or SiN) film 112 on the surface of the STI film 111, the surfaces and sidewalls of the alternating layers 110, and the front surface of the substrate 101 may be performed. The silicon nitride film 112 may be performed by a deposition process including a CVD process, an APCVD process, an LPCVD process, or a PECVD process. The silicon nitride film 112 may be used to prevent short circuit between a gate electrode and a source/drain in a post process and a selective etching process of forming a channel by using the silicon layers 103, 105, and 107.

Figure 7:
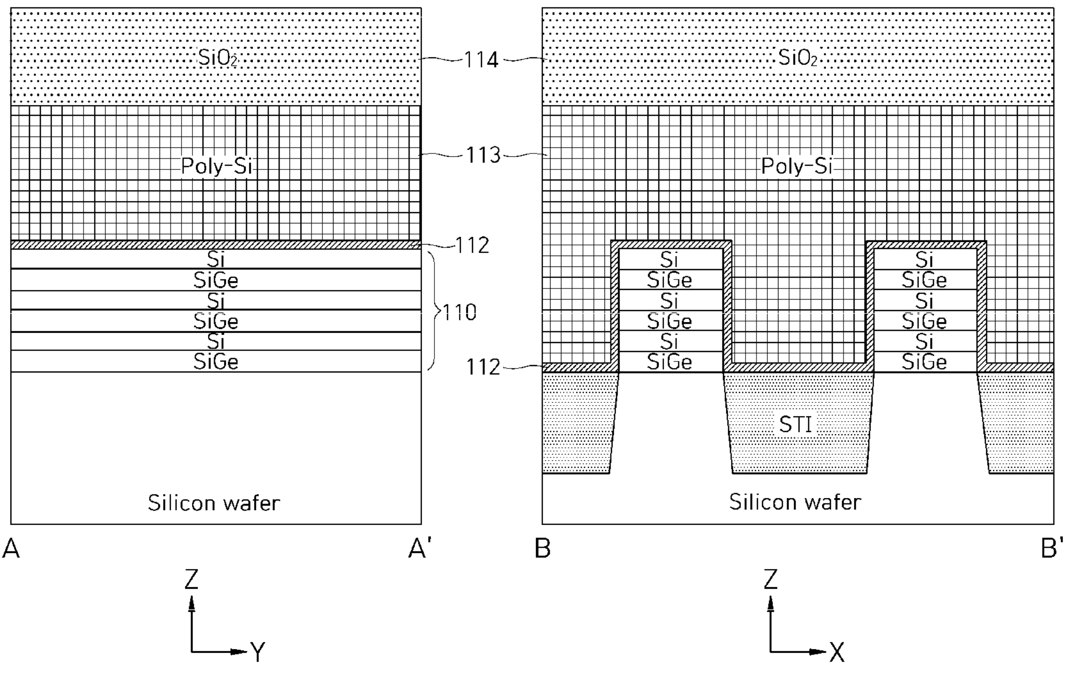
Figure 8:
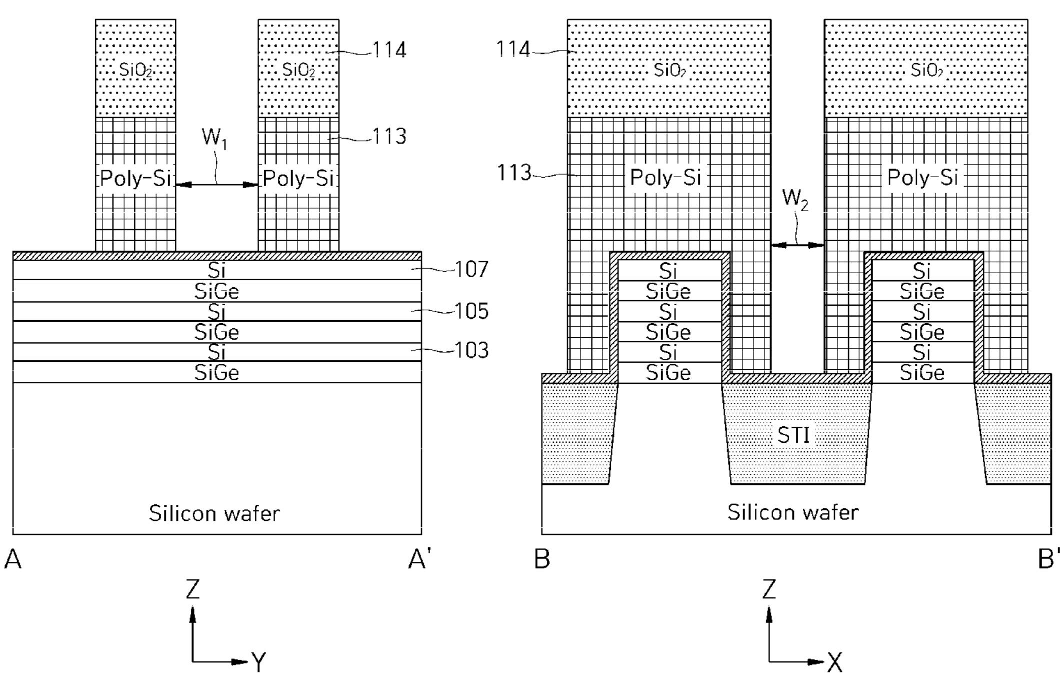
Figure 9:
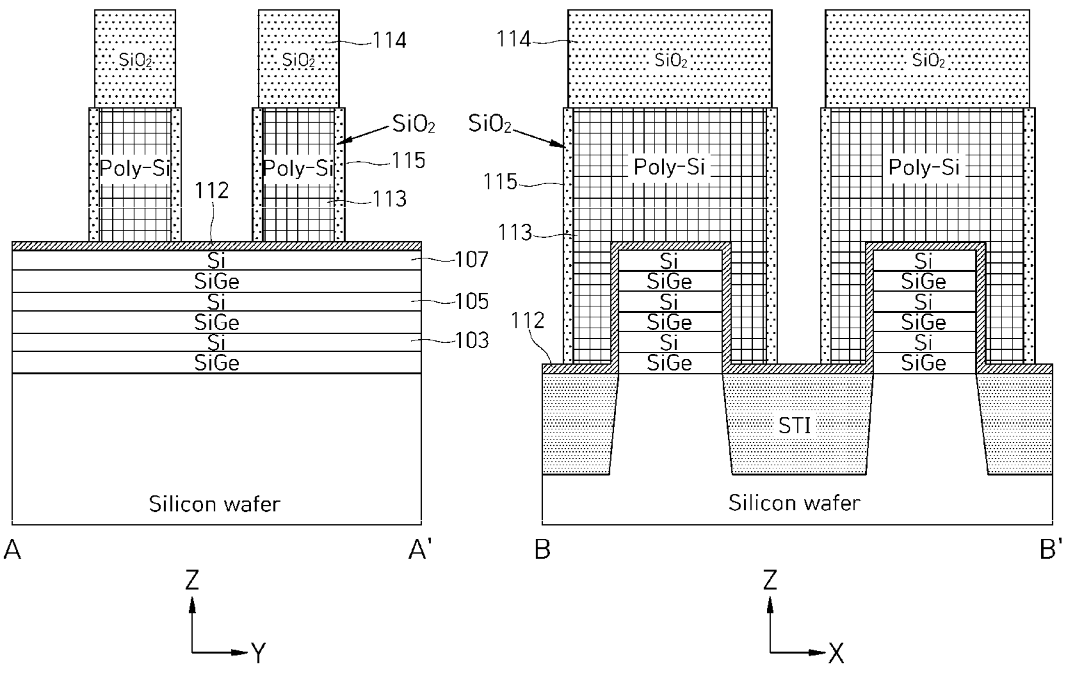

Referring to FIGS. 7 to 9, a dummy gate 113 and a first silicon oxide film 114 may be sequentially formed on the alternating layers 110 with the silicon nitride film 112 therebetween (FIGS. 7 and 8), and a process (FIG. 9) of forming a gate spacer in a sidewall of the dummy gate 113 may be performed.

In detail, referring to FIG. 7, the dummy gate 113 may be formed on a front surface of the silicon nitride film 112. Therefore, the dummy gate 113 may be formed on the alternating layers 110 with the silicon nitride film 112 therebetween. The dummy gate 113 may be performed by a deposition process including a CVD process, an APCVD process, an LPCVD process, or a PECVD process. The dummy gate 113 may include poly silicon (poly-Si), silicon germanium (SiGe), or amorphous silicon, or may include a material having a high etching selectivity with respect to the first silicon oxide film 114. Subsequently, the first silicon oxide film 114 may be formed on the front surface of the dummy gate 113. The first silicon oxide film 114 may be performed by a deposition process including a CVD process, an APCVD process, an LPCVD process, or a PECVD process.

Subsequently, referring to FIG. 8, a process of etching the dummy gate 113 and the first silicon oxide film 114 corresponding to the other region except a region which is to be used as a channel layer in the silicon layers 103, 105, and 107 may be performed. The dummy gate 113 and the first silicon oxide film 114 corresponding to the other region may be etched by, for example, a photolithography process and a dry etching process. An etching width w1 of the dummy gate 113 and the first silicon oxide film 114 as seen with respect to a cut line A-A' may be set to be greater than an etching width w2 of the dummy gate 113 and the first silicon oxide film 114 as seen with respect to a cut line B-B'.

Subsequently, referring to FIG. 9, a process of forming a gate spacer 115 in the sidewall of the dummy gate 113 exposed by the etching process of FIG. 8 may be performed. The gate spacer 115 may be formed by, for example, a thermal oxidation process. The gate spacer 115 may be a silicon oxide film. The silicon oxide film which is the gate spacer 115 may be referred to as a second silicon oxide film, for differentiating the first silicon oxide film 114 formed on the dummy gate 113. A width of the gate spacer 115 may be set based on a channel width of the silicon layers 103, 105, and 107.

Figure 10:
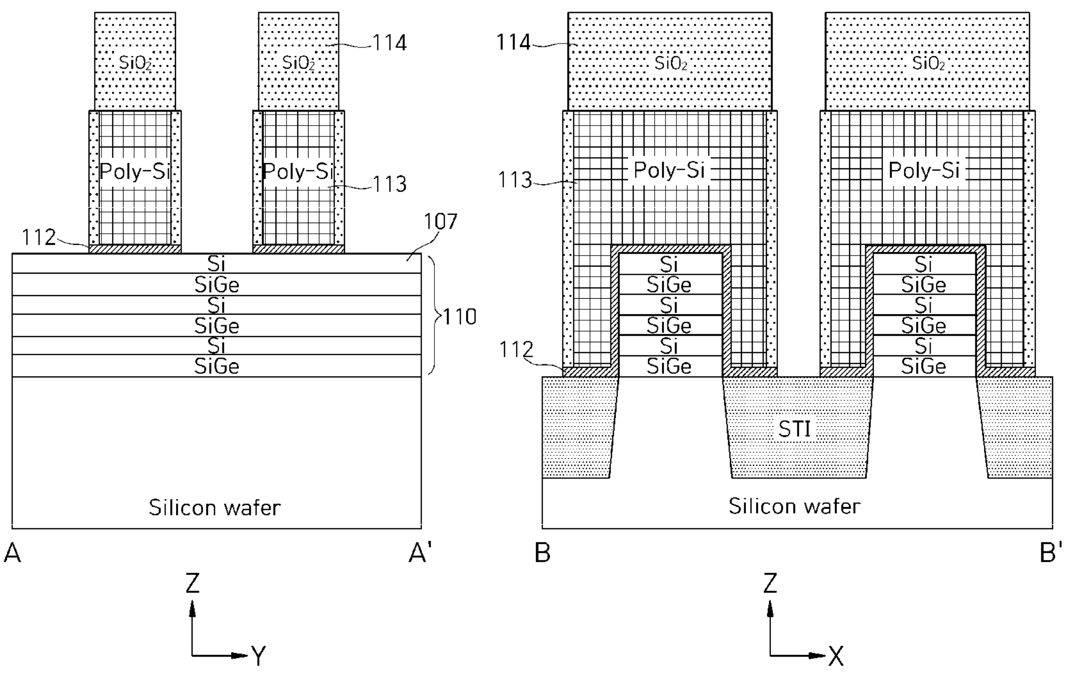
Figure 11:
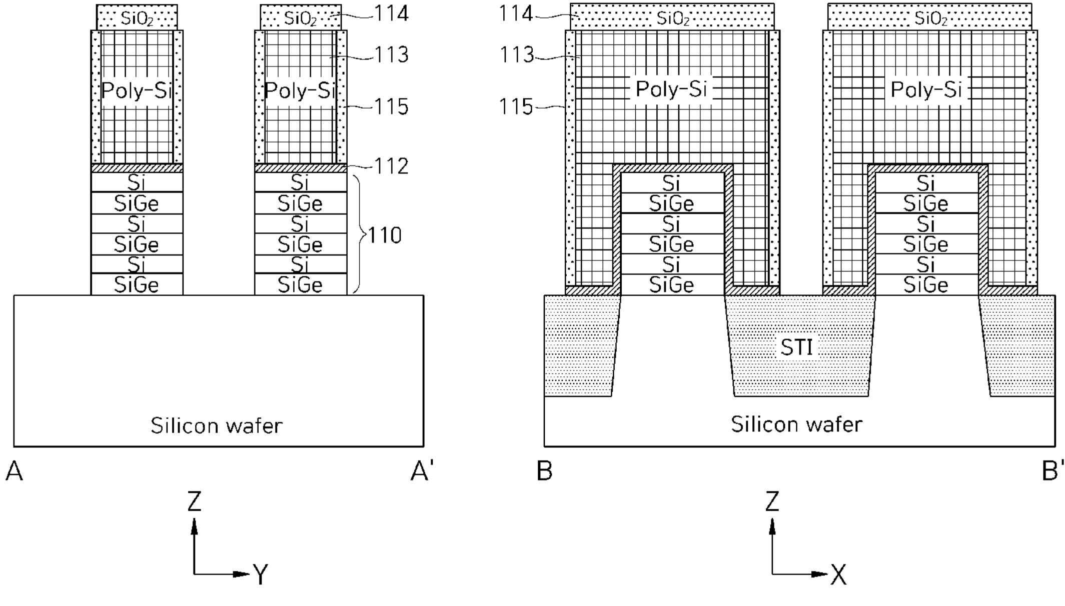

Referring to FIGS. 10 and 11, after the gate spacer 115 is formed in the sidewall of the dummy gate 113, the silicon nitride film 112 upward exposed may be selectively etched (FIG. 10), and then, a process (FIG. 11) of etching the alternating layers 110 by using the first silicon oxide film 114, formed on the dummy gate 113, as a hard mask may be performed (FIG. 11).

In FIG. 10, the silicon nitride film 112 may be etched by, for example, a dry or wet etching process, and preferably, may be etched by a dry etching process, and a partial surface of the alternating layers 110 may be upward exposed by etching of the silicon nitride film 112. The partial surface of the alternating layers 110 may denote a partial surface of the silicon layer 107 disposed at an uppermost end.

In FIG. 11, without a photolithography process, a process of etching the alternating layers 110 by using the first silicon oxide film 114, formed on the dummy gate 113, as a hard mask may be performed. In this case, the gate spacer 115 which is a second silicon oxide film formed in the sidewall of the dummy gate 113 may be used as a hard mask also. Accordingly, the sidewall of the dummy gate 113 may not be exposed in etching the alternating layers 110.

Figure 12:
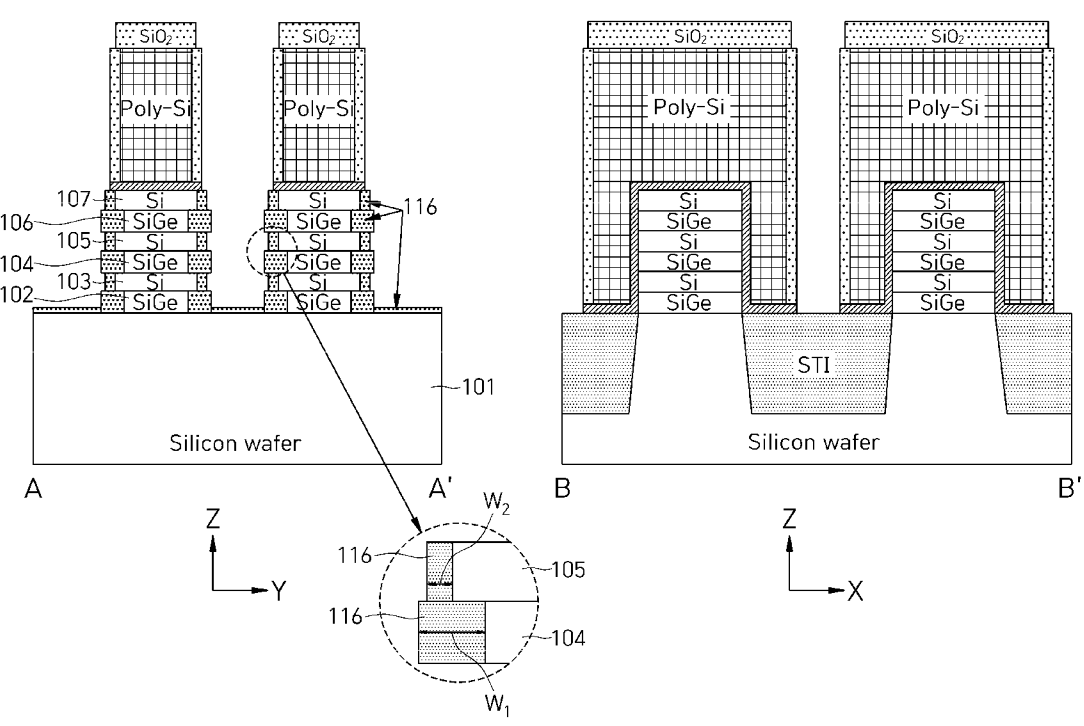
Figure 13:
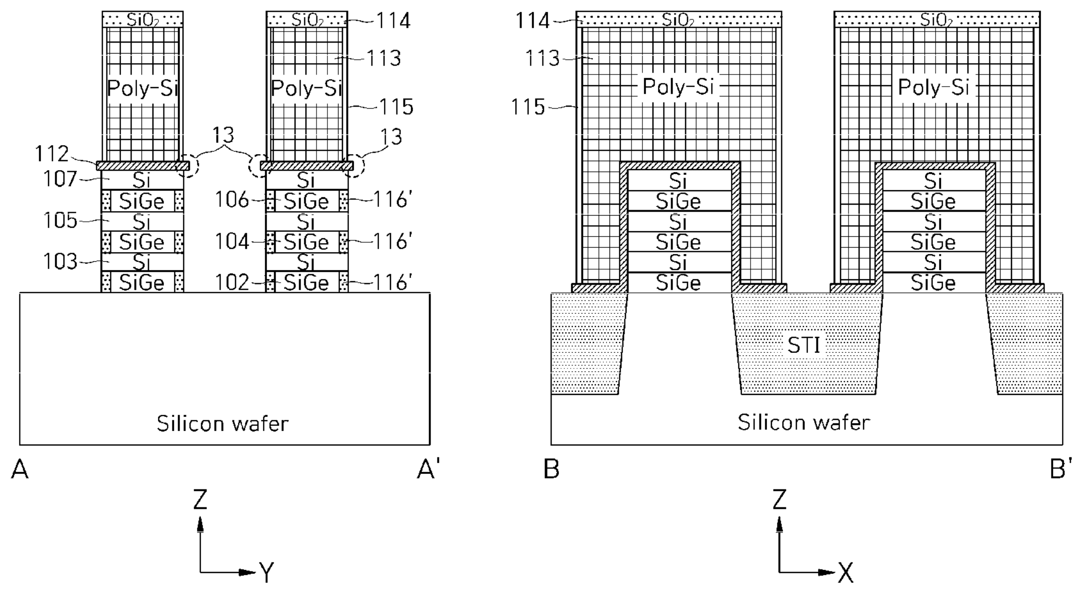

Referring to FIGS. 12 and 13, a process of selectively forming the inner spacer 116' in sidewalls of silicon germanium layers 102, 104, and 106 among the silicon layers 103, 105, and 107 and the silicon germanium layers 102, 104, and 106 of the etched alternating layers 110 may be performed.

In detail, referring to FIG. 12, a process of forming a silicon oxide film 116 on sidewalls of the silicon germanium layers 102, 104, and 106 and the silicon layers 103, 105, and 107 of the etched alternating layers 110 may be performed. In this case, the silicon oxide film 116 may also be formed on the substrate 101 in the same process. To differentiate terms from one another, the silicon oxide film 116 formed on the sidewalls of the silicon germanium layers 102, 104, and 106 and the silicon layers 103, 105, and 107 and the substrate 101 may be referred to as a third silicon oxide film.

The third silicon oxide film 116 may be formed by a thermal oxidation process. The thermal oxidation process may be a wet oxidation process or a dry oxidation process, and preferably, may be a wet oxidation process. The wet oxidation process may be performed at a temperature of about 800° C. or less, and preferably, may be performed at a temperature of about 700° C. to about 800° C., so as to finely adjust widths of the silicon germanium layers 102, 104, and 106 and the silicon layers 103, 105, and 107.

In the dry oxidation process, there may hardly be an oxidation speed difference between the silicon germanium layers 102, 104, and 106 and the silicon layers 103, 105, and 107. However, in the wet oxidation process, an oxidation speed of the silicon germanium layers 102, 104, and 106 may be higher than that of the silicon layers 103, 105, and 107. This may be caused by a germanium component included in the silicon germanium layers 102, 104, and 106, and as a mole fraction of germanium increases, a growth speed of the third silicon oxide film 116 may increase. In an oxidation process of a silicon germanium layer, a germanium component may not participate in an oxidation operation. Accordingly, the germanium component may be condensed in the silicon germanium layer, and as an oxidation process is performed, a mole fraction of germanium of the silicon germanium layer may increase.

Therefore, for the same time, the third silicon oxide film 116 formed on the sidewalls of the silicon germanium layers 102, 104, and 106 may grow to have a first width W1 in a center direction of the silicon germanium layers 102, 104, and 106, and the third silicon oxide film 116 formed on the sidewalls of the silicon layers 103, 105, and 107 may grow to have a second width W2 in a center direction of the silicon layers 103, 105, and 107.

In the wet oxidation process, a growth speed of the third silicon oxide film 116 formed on the sidewalls of the silicon layers 103, 105, and 107 may differ from a growth speed of the third silicon oxide film 116 formed on the sidewalls of the silicon germanium layers 102, 104, and 106, but each of the silicon oxide films 116 may be formed to have a very accurate width. Accordingly, the wet oxidation process may be better than the dry oxidation process, in terms of finely adjusting widths of the silicon layers 103, 105, and 107 and the silicon germanium layers 102, 104, and 106 remaining after the silicon oxide film 116 is grown. Also, the wet oxidation process may be better than the dry oxidation process, in terms of preventing a phenomenon where a boundary between a silicon layer and a silicon germanium layer is unclear due to diffusion of germanium.

Referring to FIG. 13, when the third silicon oxide film 116 is grown to have different widths on the sidewalls of the silicon layers 103, 105, and 107 and the silicon germanium layers 102, 104, and 106, a process of etching the third silicon oxide film 116 may be performed until the sidewalls of the silicon layers 103, 105, and 107 are exposed. That is, an etching process of the third silicon oxide film 116 may stop in a state where the third silicon oxide film formed on the sidewalls of the silicon germanium layers 102, 104, and 106 remains. Here, in a state where the sidewalls of the silicon layers 103, 105, and 107 are exposed, the third silicon oxide film 116 remaining on the sidewalls of the silicon germanium layers 102, 104, and 106 may be the inner spacer 116'.

An etching process of the third silicon oxide film 116 performed until the sidewalls of the silicon layers 103, 105, and 107 are exposed may be, for example, a dry etching process or a wet etching process, and preferably, may be a wet etching process.

An etching process of the third silicon oxide film 116 may be performed so that the gate spacer 115, which is a second silicon oxide film formed on the sidewall of the dummy gate 113, is not completely removed. Also, an etching process of the third silicon oxide film 116 may be performed so that the first silicon oxide film 114 formed on the dummy gate 113 is not completely removed.

The inner spacer 116' may determine a channel length based on the silicon layers 103, 105, and 107, in a post process of removing the silicon germanium layers 102, 104, and 106 used as a sacrificial layer.

Moreover, the inner spacer 116' may support the silicon layers 103, 105, and 107 used as a channel layer. That is, the inner spacer 116' may be used as a structure which supports a space (19 of FIG. 19) between silicon layers formed by a post process (FIG. 19) of removing the silicon germanium layers 102, 104, and 106.

Furthermore, in an etching process of the third silicon oxide film 116 on the sidewalls of the silicon germanium layers 102, 104, and 106 and the silicon layers 103, 105, and 107, the silicon nitride film 112 may be hardly etched due to a high etching selectivity with respect to the first silicon oxide film 114 and the third silicon oxide film 116. Therefore, when seen with respect to the cut line A-A', both end portions 13 of the un-etched silicon nitride film 112 may protrude with respect to the sidewalls of the silicon layers 103, 105, and 107. The protruding both end portions 13 of the silicon nitride film 112 may be used as an insulator which prevents (blocks) short circuit between a gate electrode and a source/drain formed in a post process.

Figure 14:
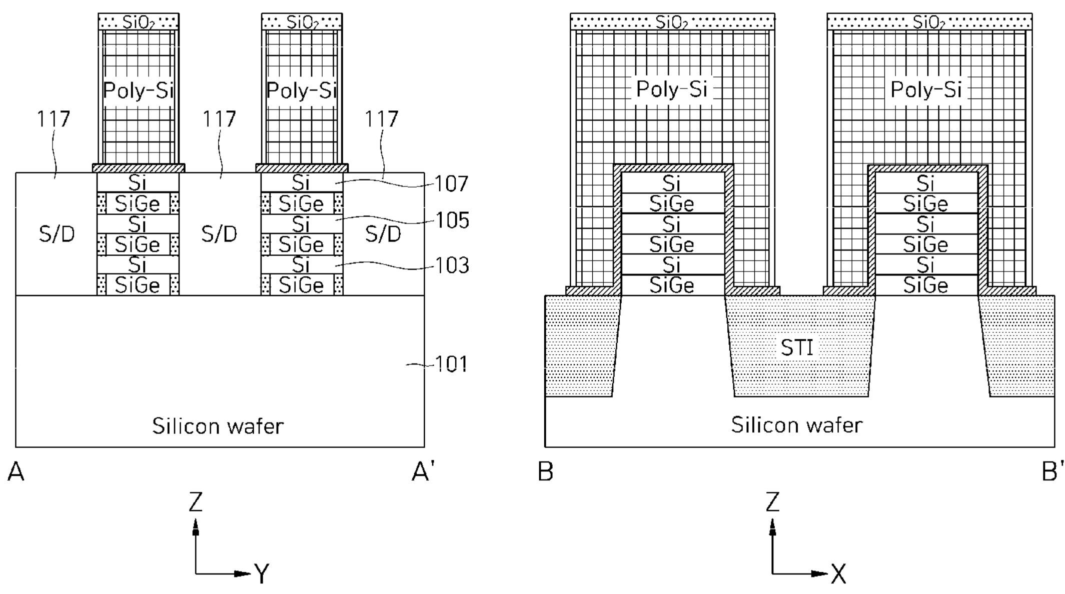

Referring to FIG. 14, after the inner spacer 116' is formed, a process of forming a source/drain (S/D) 117 on both sides of the alternating layers 110 including the silicon germanium layers 102, 104, and 106 and the silicon layers 103, 105, and 107 by using the substrate 101 including a silicon material and the silicon layers 103, 105, and 107 as a seed layer may be performed.

The source/drain 117 may be formed by a selective epitaxial growth process. The selective epitaxial growth process may include, for example, an ion implantation process of doping n-type impurities or p-type impurities, based on a device type (an n-type FET or a p-type FET).

A material for selectively growing the source/drain 117 may use, for example, silicon germanium (SiGe) and/or silicon carbide (SiC). Also, because the source/drain 117 according to an embodiment of the present invention uses the substrate 101 including a silicon material and the silicon layers 103, 105, and 107 as a seed layer, the sources/drains 117 may be grown to meet each other by starting growth at different growth times. Accordingly, the source/drain 117 may be grown as a multi-crystal type.

Figure 15:
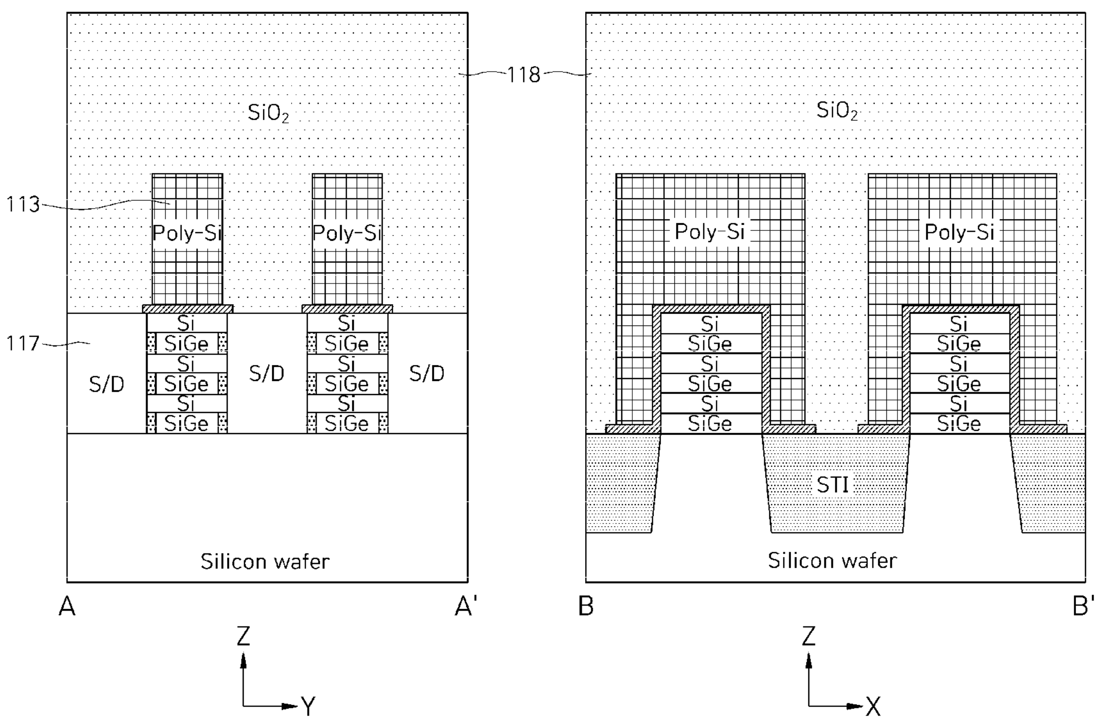

Referring to FIG. 15, a process of forming a silicon oxide film 118 covering the dummy gate 113 and the source/drain 117 may be performed. The silicon oxide film 118 may be referred to as a fourth silicon oxide film, so as to be differentiated from the first silicon oxide film 113, the second silicon oxide film used as the gate spacer 115, and the third silicon oxide film used as the inner spacer 116'. The fourth silicon oxide film 118 may be formed by, for example, a physical vapor deposition (PVD) process, a CVD process, or an atomic layer deposition (ALD) process. Here, the PVD process may include a thermal evaporation process, an e-beam evaporation process, and a sputtering process, and the CVD process may include a thermal CVD process, a plasma enhanced (PE) CVD, an atmospheric pressure (AP) CVD process, and a low pressure (LP) CVD process.

Figure 16:
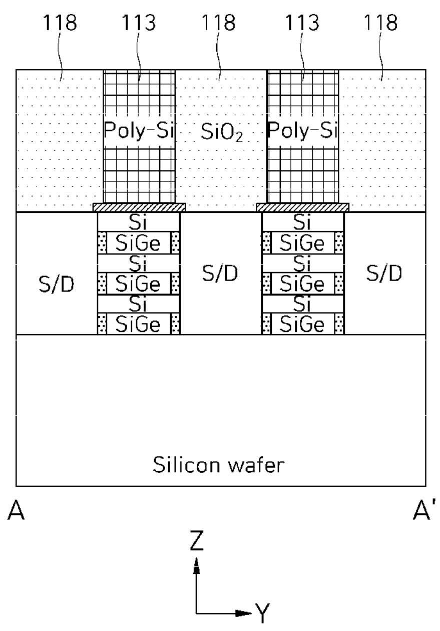
Figure 16:
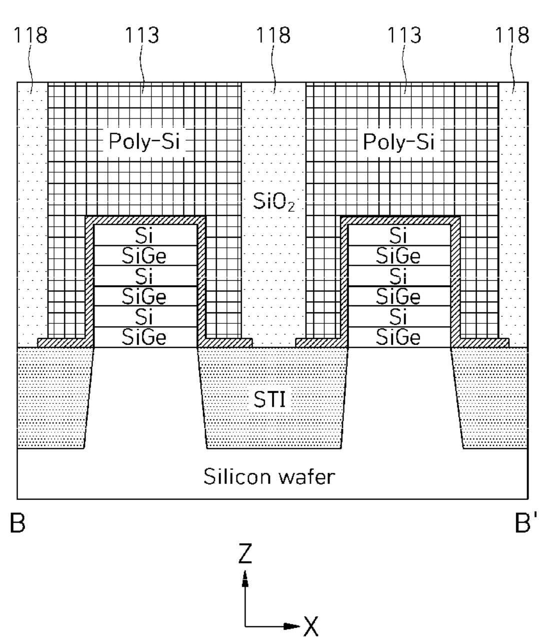

Referring to FIG. 16, a process of polishing the fourth silicon oxide film 118 to expose a surface of the dummy gate 113 may be performed. The fourth silicon oxide film 118 may be polished by a CMP process.

Figure 17:
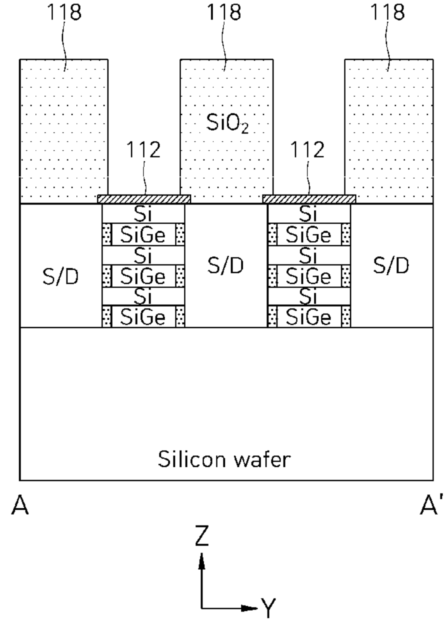
Figure 17:
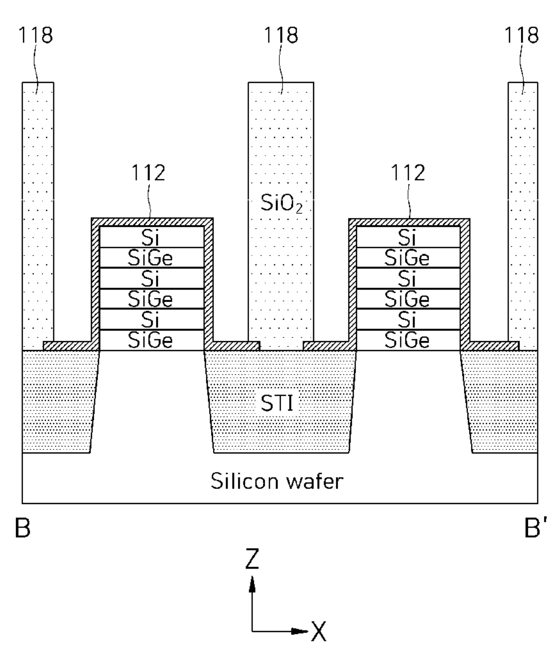

Referring to FIG. 17, a process of removing the exposed dummy gate 113 may be performed. The dummy gate 113 may be removed by an etching process having a high etching selectivity with respect to the fourth silicon oxide film 118 and the silicon nitride film 112. The etching process may be, for example, a wet etching process or a dry etching process.

Figure 18:
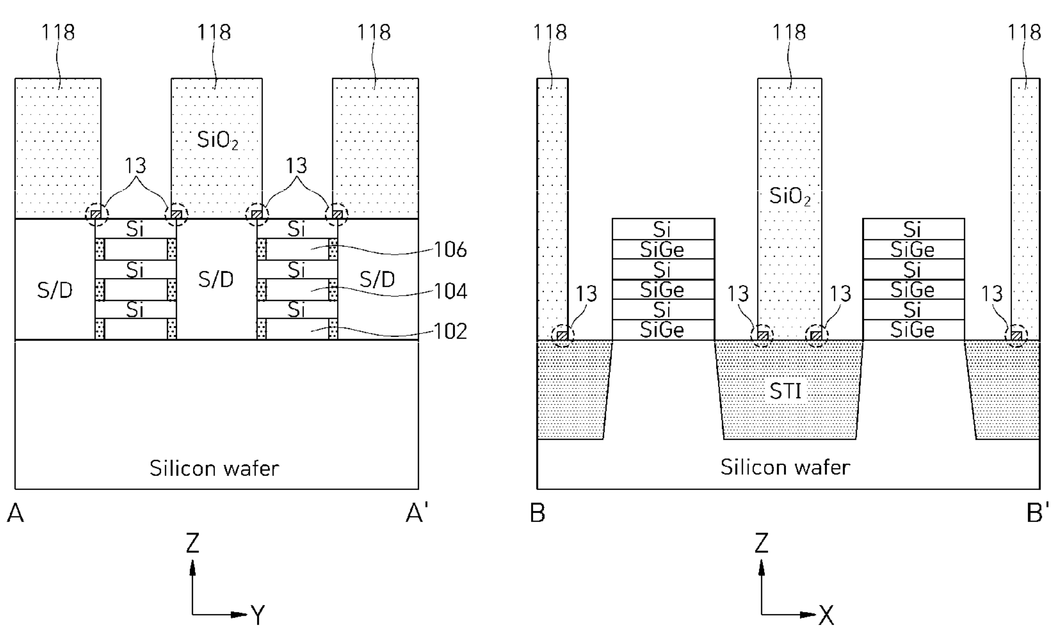

Referring to FIG. 18, an etching process of removing the silicon nitride film 112 upward exposed by the removal of the dummy gate 113 may be performed. The removal of the silicon nitride film 112 may be performed by an etching process having a high etching selectivity with respect to the fourth silicon oxide film 118. At this time, the both end portions 13 of the silicon nitride film 112 covered by the fourth silicon oxide film 118 may not be etched by the fourth silicon oxide film 118. The both end portions 13 of the silicon nitride film 112, which are not removed by the etching process, may protrude to an inner portion of the fourth silicon oxide film 118. The protruding both end portions 13 of the silicon nitride film 112 may maintain an interval between a gate electrode (120 of FIG. 22) and a source/drain 117 formed by a post process and may function as an insulator which prevents short circuit between the gate electrode (120 of FIG. 22) and the source/drain 117. Furthermore, an etching process for removing the silicon nitride film 112 may be, for example, a dry etching process or a wet etching process. To finely control the interval between the gate electrode (120 of FIG. 22) and the source/drain 117, it may be preferable to remove the silicon nitride film 112 by using a dry etching process favorable to fine etching.

Figure 19:
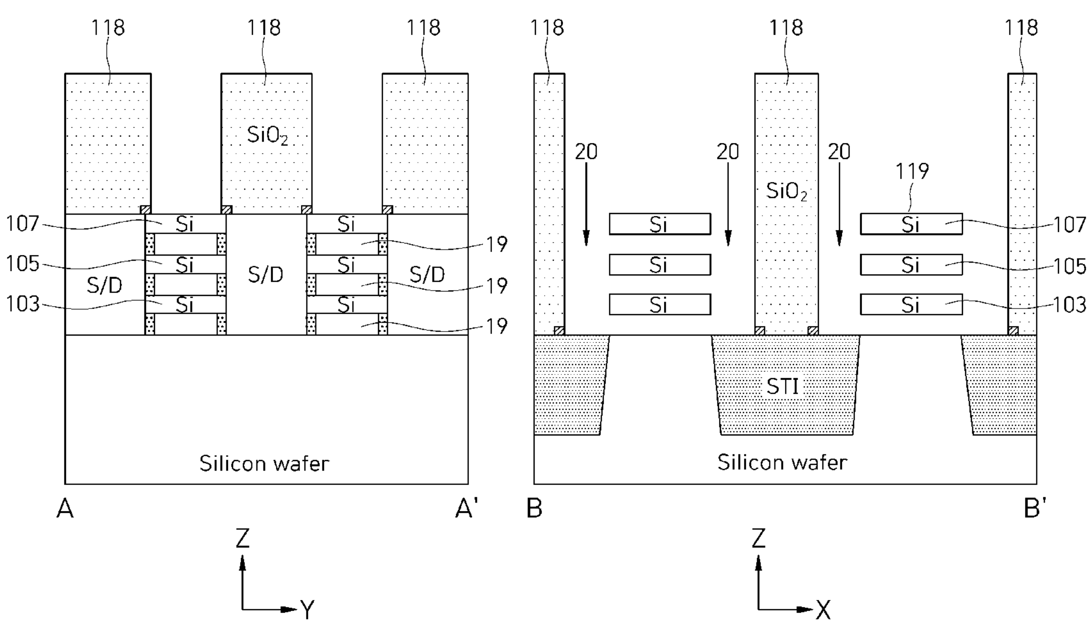

Referring to FIG. 19, when the removal of the silicon nitride film 112 is completed, a process of selectively removing the silicon germanium layers (102, 104, and 106 of FIG. 18) formed between the silicon layers 103, 105, and 107 may be performed. The removal of the silicon germanium layers (102, 104, and 106 of FIG. 18) may be performed by, for example, an etching process including a dry etching process or a wet etching process. When seen with respect to the cut line B-B', an etching process of the silicon germanium layers (102, 104, and 106 of FIG. 18) may be performed by using an etching material (for example, an etchant or an etching gas) implanted through a space 20 formed between the sidewalls of the silicon layers 103, 105, and 107 and a sidewall of the fourth silicon oxide film 118.

Figure 20:
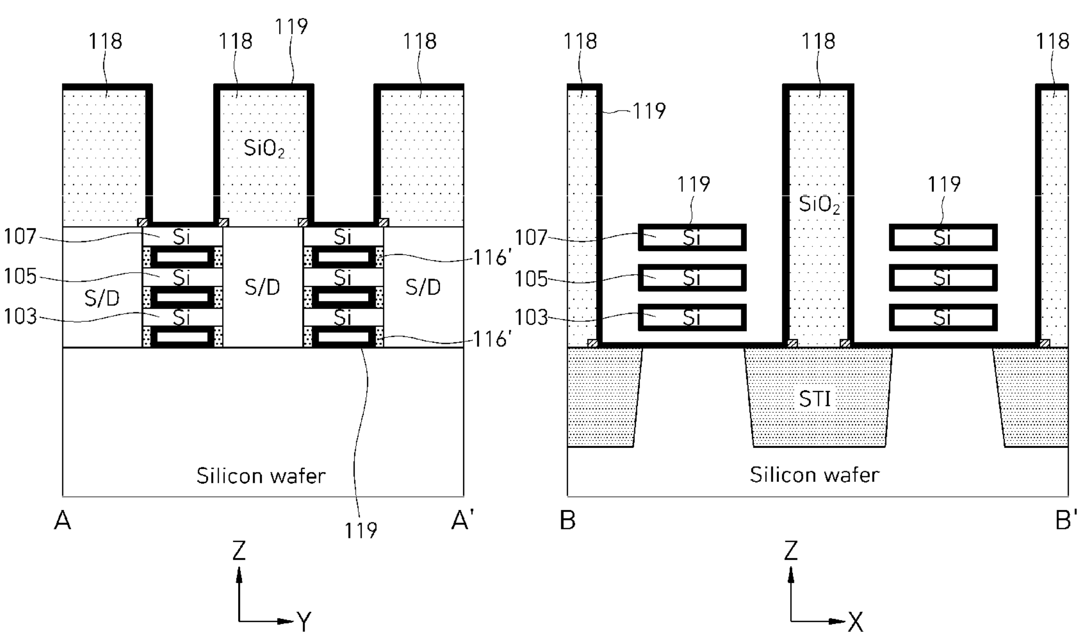

Referring to FIG. 20, when the removal of the silicon germanium layers (102, 104, and 106 of FIG. 18) is completed, a process of forming the gate dielectric layer 119 on inner sidewalls of the inner spacer 116' and all surfaces of the silicon layers 103, 105, and 107 exposed by the removal of the silicon germanium layers (102, 104, and 106 of FIG. 18) and the fourth silicon oxide film 110 may be performed. The gate dielectric layer 119 may include silicon oxide, silicon nitride, or a high-k dielectric material (for example, hafnium (Hf), zirconium (Zr), aluminum (Al), lanthanum (La), magnesium (Mg), barium (Ba), titanium (Ti), and lead (Pb), or metal oxide based on a combination thereof, and silicate). The gate dielectric layer 119 may be formed by, for example, a deposition process including an atomic layer deposition (ALD) process.

Figure 21:
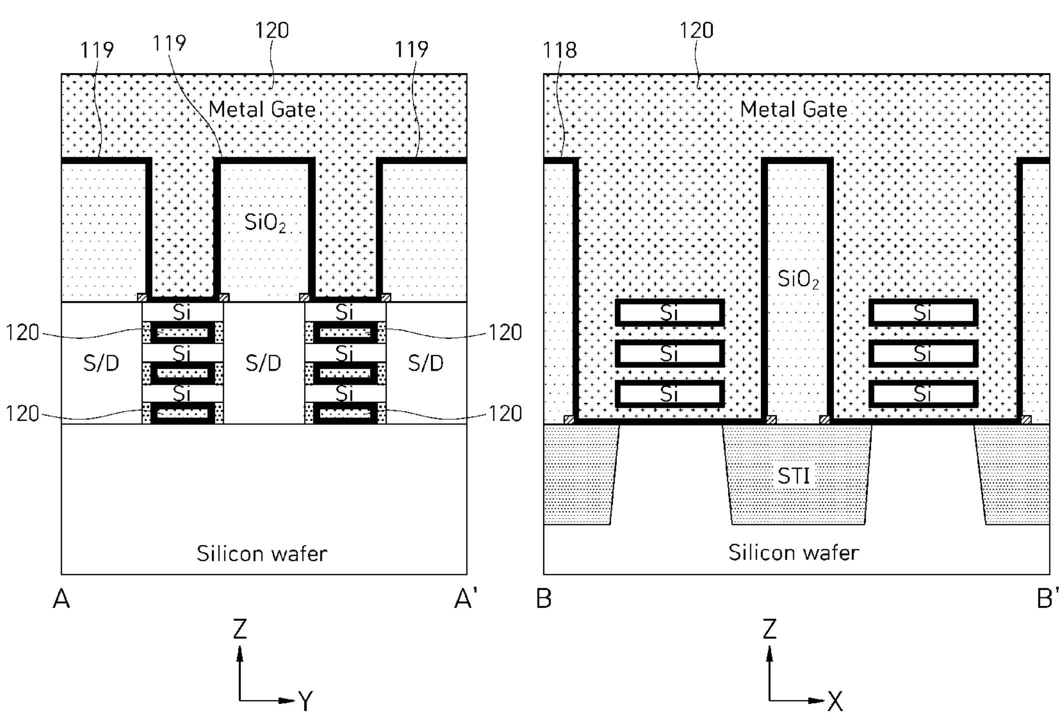
Figure 22:
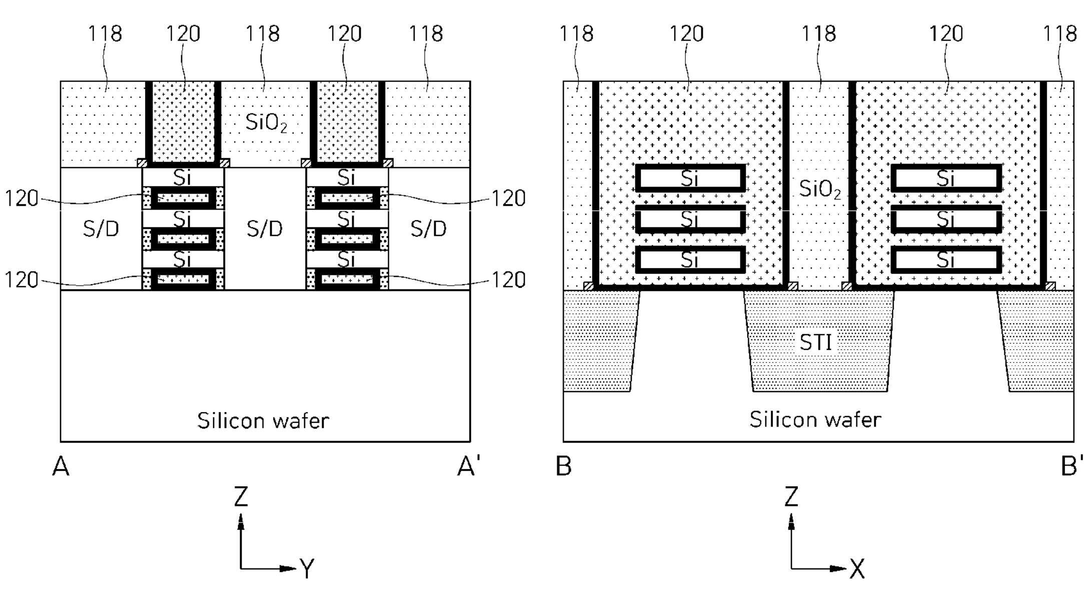

Referring to FIG. 21, when the formation of the gate dielectric layer 119 is completed, a process of forming the gate electrode 120 on the gate dielectric layer 119 may be performed. A material of the gate electrode 120 may be, for example, Ti, Al, copper (Cu), or tungsten (W), or a combination thereof. The gate electrode 120 may be formed by, for example, an ALD process or an electroplating or electroless plating deposition Referring to FIG. 22, when the formation of the gate electrode 120 is completed, a process of identically forming thicknesses of the gate electrode 120 and the fourth silicon oxide film 118 by using a CMP process may be performed. For example, the CMP process may stop when a surface of the fourth silicon oxide film 118 is exposed. As the CMP process on the gate electrode 120 is completed, a GAA-FET device may be finished.

A semiconductor device manufactured by the manufacturing method according to the embodiments described above may be implemented as a semiconductor package having various types. For example, the semiconductor device according to the embodiments of the present invention may be packaged a type such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi-chip package (MCP), wafer-level fabricated package (WFP), or wafer-level processed stack package (WSP).

According to the embodiments of the present invention, because the low-temperature recurring cooling process is used for decreasing a stress occurring in a process of repeatedly growing a silicon germanium layer used as a sacrificial layer and a silicon layer used as a channel layer, a single crystal silicon layer having no defect may be stacked. Accordingly, the number of stacks of silicon layers used as the channel layer may increase, a driving current may be enhanced, and a leakage current may be reduced.

Moreover, an inner spacer may be formed in both sidewalls of a silicon germanium layer used as a sacrificial layer, and thus, may support a space between silicon layers formed by removing the silicon germanium layer.

Moreover, the inner spacer may be easily formed through a thermal oxidation process, and thus, a channel length may be easily adjusted.

Moreover, a mole fraction of a silicon germanium layer may increase based on condensing of germanium by the thermal oxidation process, and thus, the silicon germanium layer may be selectively and easily etched.

Moreover, a silicon nitride film may not be completely removed and both end portions of the silicon nitride film may be maintained in a process of removing the silicon nitride film formed on a silicon layer, and thus, short circuit between a gate electrode and a source/drain may be easily prevented by the both end portions of the silicon nitride film.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing a semiconductor device, the method comprising:

forming alternating layers, where a silicon germanium layer and a silicon layer are alternately stacked, on a substrate;

patterning and etching the alternating layers to form a fin structure protruding onto the substrate, and then, forming a silicon nitride film on a surface and a sidewall of each of the alternating layers having the fin structure;

sequentially forming a dummy gate and a silicon oxide film on the alternating layers with the silicon nitride film therebetween, and then, forming a gate spacer on a sidewall of the dummy gate;

etching the silicon nitride film upward exposed, and then, etching the alternating layers by using the silicon oxide film as a hard mask; and selectively forming an inner spacer in a sidewall of each of silicon germanium layers among the silicon germanium layers and silicon layers of the etched alternating layers by etching a silicon oxide film formed on sidewalls of the silicon germanium layers and the silicon layers until the sidewalls of the silicon layers are exposed, wherein, when etching the silicon oxide film, the silicon nitride film is hardly etched based on an etching selectivity between the silicon nitride film and the silicon oxide film, such that both end portions of the un-etched silicon nitride film protrude with respect to the sidewalls of each of the silicon layers.

2. The method of claim 1, wherein the forming of the alternating layers comprises:

sequentially growing the silicon germanium layer and the silicon layer at a first temperature by using an epitaxial growth process;

cooling the silicon germanium layer and the silicon layer at a second temperature which is lower than the first temperature;

sequentially growing another silicon germanium layer and another silicon layer on the silicon layer at the first temperature by using the epitaxial growth process; and cooling the other silicon germanium layer and the other silicon layer at the second temperature by using the cooling process.

3. The method of claim 2, wherein the first temperature is about 500° C. to about 800° C., and the second temperature is about 300° C. to about 400° C.

4. The method of claim 1, wherein the silicon nitride film has a function of preventing short circuit between a gate electrode and a source/drain in a post process.

5. The method of claim 1, wherein the forming of the gate spacer comprises forming a gate spacer in the sidewall of the dummy gate by using a thermal oxidation process.

6. The method of claim 1, wherein the forming of the inner spacer comprises:

forming the silicon oxide film on the sidewall of each of the silicon germanium layers and the silicon layers of the etched alternating layers; and forming, as the inner spacer, the silicon oxide film remaining on the sidewalls of the silicon germanium layers in a state where the sidewalls of the silicon layers are exposed.

7. The method of claim 6, wherein the forming of the silicon oxide film comprises growing the silicon oxide film on the sidewall of each of the silicon germanium layers and the silicon layers by using a thermal oxidation process.

8. The method of claim 6, wherein the forming of the silicon oxide film comprises growing the silicon oxide film on the sidewall of each of the silicon germanium layers and the silicon layers by using a wet oxidation process.

9. The method of claim 8, wherein the silicon oxide film formed on the sidewall of each of the silicon germanium layers is grown to have a first width in a center direction of the silicon germanium layers, and the silicon oxide film formed on the sidewall of each of the silicon layers is grown to have a second width in a center direction of the silicon layers.

10. The method of claim 8, wherein the wet oxidation process is performed at a temperature of about 700° C. to about 800° C.

11. The method of claim 1, wherein the etching of the silicon oxide film comprises etching the silicon oxide film by using a wet etching process.

12. The method of claim 1, wherein the protruding both end portions of the silicon nitride film are used as an insulator which prevents short circuit between a gate electrode and a source/drain formed in a post process.

13. The method of claim 1, wherein, in the forming of the inner spacer, the inner spacer functions as a structure which supports a space between the silicon layers formed by a post process of removing the silicon germanium layers used as a sacrificial layer.

14. The method of claim 1, wherein, in the forming of the inner spacer, the inner spacer functions as a structure which determines a channel length based on silicon layers which are the silicon layers included in the alternating layers and are used as a channel layer.

15. The method of claim 1, further comprising:

after the selectively forming of the inner spacer, forming a source/drain by using the silicon layers and the substrate as a seed layer;

forming a silicon oxide film covering the source/drain and the dummy gate;

polishing the silicon oxide film to expose a surface of the dummy gate;

removing the exposed dummy gate;

removing the silicon nitride film exposed by the removal of the dummy gate;

selectively removing the silicon germanium layers formed between the silicon layers;

forming a gate dielectric layer on a surface of the silicon oxide film, on a sidewall of the silicon oxide film exposed by the removal of the dummy gate, and on all surfaces of each of the silicon layers exposed by the removal of the silicon germanium layers; and forming the gate electrode on the gate dielectric layer.

16. The method of claim 15, wherein, in the etching and removing of the silicon nitride film, both end portions of the silicon nitride film protruding to an inner portion of the silicon oxide film are not removed by the silicon oxide film.

17. The method of claim 16, wherein the both end portions of the silicon nitride film maintain an interval between the gate electrode and the source/drain.

18. The method of claim 16, wherein the both end portions of the silicon nitride film function as an insulator which prevents short circuit between the gate electrode and the source/drain.

* * * * *